(12) United States Patent
Xie

(10) Patent No.: US 9,773,813 B2
(45) Date of Patent: Sep. 26, 2017

(54) THIN FILM TRANSISTOR AND A MANUFACTURING METHOD THEREOF, ARRAY SUBSTRATE AND A MANUFACTURING METHOD THEREOF, DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Zhenyu Xie, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 116 days.

(21) Appl. No.: 14/435,687

(22) PCT Filed: Aug. 16, 2014

(86) PCT No.: PCT/CN2014/084576
§ 371 (c)(1),
(2) Date: Apr. 14, 2015

(87) PCT Pub. No.: WO2015/131495
PCT Pub. Date: Sep. 11, 2015

(65) Prior Publication Data
US 2016/0141311 A1    May 19, 2016

(30) Foreign Application Priority Data
Mar. 7, 2014    (CN) .......................... 2014 1 0083721

(51) Int. Cl.
*H01L 27/12* (2006.01)
*H01L 29/786* (2006.01)
(Continued)

(52) U.S. Cl.
CPC .... *H01L 27/1222* (2013.01); *H01L 21/02488* (2013.01); *H01L 21/02532* (2013.01);
(Continued)

(58) Field of Classification Search
USPC .................... 257/72; 438/166, 151
See application file for complete search history.

(56) References Cited

U.S. PATENT DOCUMENTS

2004/0084677 A1* 5/2004 Tsao .................... H01L 21/2026
257/72
2005/0019995 A1   1/2005 Chang
(Continued)

FOREIGN PATENT DOCUMENTS

CN        1316770 A     10/2001
CN        1492475 A     4/2004
(Continued)

OTHER PUBLICATIONS

Dec. 1, 2014—(WO)—International Search Report and Written Opinion PCT/CN2014/084576 with English Tran.
(Continued)

*Primary Examiner* — Zandra Smith
*Assistant Examiner* — Lawrence Tynes, Jr.
(74) *Attorney, Agent, or Firm* — Banner & Witcoff, Ltd.

(57) ABSTRACT

A thin film transistor and a manufacturing method thereof, an array substrate and a manufacturing method thereof, and a display device are disclosed. The manufacturing method of the array substrate includes depositing an amorphous silicon thin film layer on a base substrate; performing a patterning process on the amorphous silicon thin film layer, so as to form a pattern with multiple small pores at a surface of the amorphous silicon thin film layer. With this method, when a laser annealing treatment of amorphous silicon is performed, the molten silicon after melting fills the space of small pores at a surface of the amorphous silicon thin film layer firstly, thereby avoiding forming a protruded grain boundary that is produced because the excess volume of polysilicon is squeezed.

14 Claims, 3 Drawing Sheets

(51) Int. Cl.
*H01L 29/66* (2006.01)
*H01L 21/02* (2006.01)

(52) U.S. Cl.
CPC .... *H01L 21/02675* (2013.01); *H01L 27/1262* (2013.01); *H01L 27/1274* (2013.01); *H01L 27/1288* (2013.01); *H01L 29/66757* (2013.01); *H01L 29/78675* (2013.01)

(56) References Cited

U.S. PATENT DOCUMENTS

| | | | |
|---|---|---|---|
| 2007/0015066 A1* | 1/2007 | Sun | G03F 1/14 430/5 |
| 2007/0212855 A1 | 9/2007 | Kwok et al. | |
| 2011/0284861 A1 | 11/2011 | Kim et al. | |
| 2012/0301985 A1* | 11/2012 | Shin | H01L 27/1285 438/34 |

FOREIGN PATENT DOCUMENTS

| | | |
|---|---|---|
| CN | 1501449 A | 6/2004 |
| CN | 2717022 Y | 8/2005 |
| CN | 102891107 A | 1/2013 |
| CN | 103219228 A | 7/2013 |
| CN | 103887244 A | 6/2014 |

OTHER PUBLICATIONS

Apr. 25, 2016—(CN)—Second Office Action Appn 201410083721.3 with English Tran.
Jan. 4, 2016—(CN)—First Office Action Appn 201410083721.3 with English Tran.
Sep. 5, 2016—(CN)—Third Office Action Appn 201410083721.3 with English Tran.
Mar. 2, 2017—(CN)—Office Action Appn 201410083721.3 with English Tran.

* cited by examiner

THIN FILM TRANSISTOR AND A MANUFACTURING METHOD THEREOF, ARRAY SUBSTRATE AND A MANUFACTURING METHOD THEREOF, DISPLAY DEVICE

The application is a U.S. National Phase Entry of International Application No. PCT/CN2014/084576 filed on Aug. 16, 2014, designating the United States of America and claiming priority to Chinese Patent Application No. 201410083721.3 filed on Mar. 7, 2014. The present application claims priority to and the benefit of the above-identified applications and the above-identified applications are incorporated by reference herein in their entirety.

TECHNICAL FIELD

At least one embodiment of the present invention relates to a thin film transistor and a manufacturing method thereof, an array substrate and a manufacturing method thereof and a display device.

BACKGROUND

Preparation of low temperature poly-silicon (LTPS) thin films is usually conducted in a laser crystallization manner, and an excimer laser is used as a heat source. A laser beam with evenly distributed energy may be obtained from laser light having passed through a projection system, and is projected on a glass substrate having an amorphous silicon structure formed thereon; after the amorphous silicon structure on the glass substrate absorbs the energy of the excimer laser, it can be converted into a polysilicon structure. As the whole treating process is accomplished below 600° C., common glass substrates are all suitable for the above method. FIG. 1 is a structurally schematic view illustrating a TFT (thin film transistor) array substrate having an LTPS film, and as for manufacturing of the array substrate, it is necessary that an amorphous silicon (a-si) thin film layer 3 be deposited on a SiOx/SiNx buffer layer 2 of a glass substrate 1, as shown in FIG. 2; and a laser crystallizing treatment is carried out on the amorphous silicon thin film layer 3, so that a polysilicon (P—Si) thin film layer 6 is obtained from it, as shown in FIG. 3; after that, a patterning process is performed, so as to form an active layer 4 of a TFT switch 5.

In the course of solidifying the low-temperature polysilicon, the amorphous silicon thin film layer 3 is firstly deposited on the buffer layer 2 of the glass substrate 1 in FIG. 2, and then is subjected to a laser annealing crystallization treatment so as to form the polysilicon thin film layer 6, as shown in FIG. 3.

SUMMARY

According to at least one embodiment of the present invention, there are provided a thin film transistor and a manufacturing method thereof, an array substrate and a manufacturing method thereof, and a display device, for avoiding formation of protrusive grain boundaries owing to the fact that the volume of excess polysilicon is squeezed during laser annealing of amorphous silicon.

According to at least one embodiment of the invention, there is provided a manufacturing method of an array substrate, which includes depositing an amorphous silicon thin film layer on a base substrate; performing a patterning process on the amorphous silicon thin film layer, so as to form a pattern with multiple small pores at a surface of the amorphous silicon thin film layer.

According to at least one embodiment of the invention, there is further provided a manufacturing method of a thin film transistor, which includes depositing an amorphous silicon thin film layer on a base substrate; performing a patterning process on the amorphous silicon thin film layer, so as to form a pattern with multiple small pores at a surface of the amorphous silicon thin film layer.

According to at least one embodiment of the invention, there is further provided a thin film transistor, which is made by using the above manufacturing method of the thin film transistor.

According to at least one embodiment of the invention, there is further provided an array substrate, including a base substrate and an amorphous silicon thin film layer formed on the base substrate, at a surface of which, there is a structure of multiple small pores; or, the array substrate including the above thin film transistor.

According to at least one embodiment of the invention, there is further provided a display device, which includes the above thin film transistor or array substrate.

BRIEF DESCRIPTION OF THE DRAWINGS

In order to illustrate the technical liquid of the embodiments of the invention more clearly, the drawings of the embodiments will be briefly described below; it is obvious that the drawings as described below are only related to some embodiments of the invention, but not limitative of the invention.

REFERENCE NUMERALS

1/10—base substrate;
2/20—buffer layer;
21—SiNx layer;
22—SiOx layer;
23—hole;
3/30—amorphous silicon thin film layer;
31—small pore;
4—active layer;
40—photoresist layer;
41—fully-removed region;

42—fully-retained region;
5—TFT switch;
6/60—polysilicon thin film layer.

DETAILED DESCRIPTION

In order to make objects, technical details and advantages of the embodiments of the invention apparent, hereinafter, the technical liquids of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
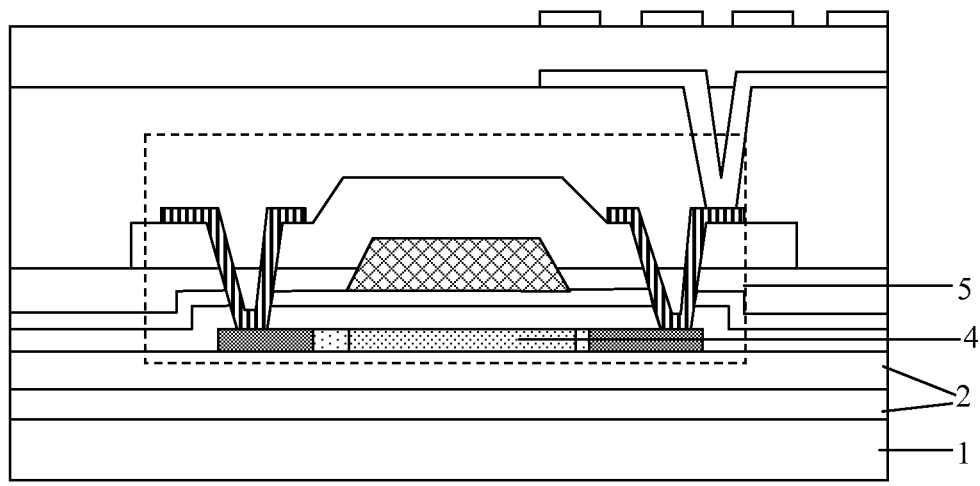
FIG. 1 is a structurally schematic view illustrating a TFT array substrate.
Figure 2:
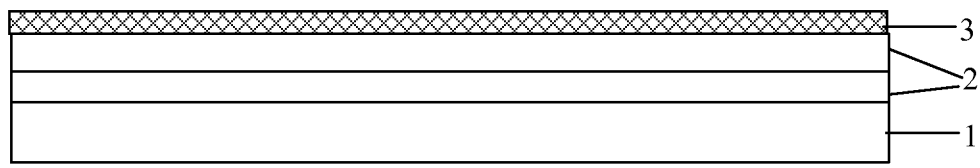
FIG. 2 is a structurally schematic view illustrating an array substrate after deposition of an amorphous silicon thin film layer.
Figure 3:
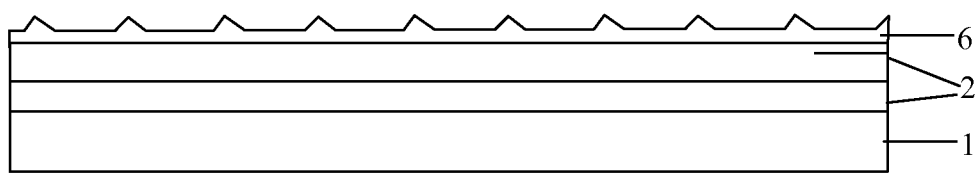
FIG. 3 is a schematic view illustrating the partial structure of an array substrate after a laser annealing treatment on amorphous silicon.

As the inventor of the present application has noted, taking a polysilicon film with a surface roughness/unevenness of 50 nm (in thickness) as an example, the height of protrusions of a surface of the polysilicon may reach 10 nm to 20 nm. The reason why the protrusions of the surface are formed lies in that the density of molten silicon after melting is relatively higher, and is 2.53 g/cm$^3$. The density of crystalline silicon is 2.3 g/cm$^3$. At the instant of laser irradiation, grains start to grow laterally from nuclei, and at this time, the solidification process goes on as the solid-liquid interface proceeds. Because the density of cured silicon is smaller, the excess volume is squeezed to an uncured region. Therefore, when the solidification process of polysilicon is completed, two adjacent grains are squeezed together to form a grain boundary, while excess volume accumulates on the grain boundary to form a protrusion, as shown in FIG. 3. On a polysilicon thin film layer 6, along with increase of the grain size, a protrusion formed by a collision that occurs in the grain-boundary area of three grains is more remarkable, and thereby, this will seriously affect characteristics of TFTs on an array substrate.

Embodiment 1

Figure 5:
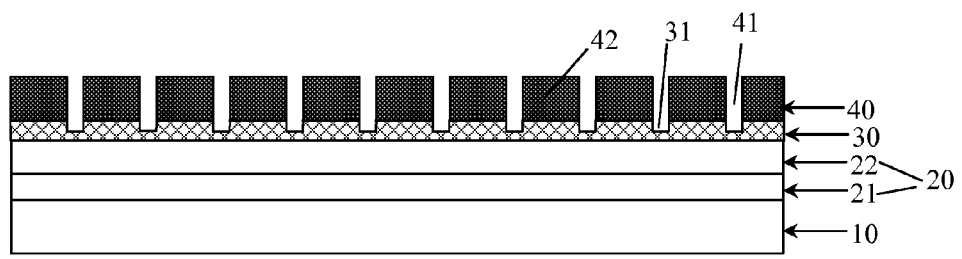
FIG. 5 is a structurally schematic view illustrating the array substrate after etching of an amorphous silicon thin film layer in the first embodiment of the invention.

As shown in FIG. 5, an array substrate according to an embodiment of the invention includes a base substrate 10 and an amorphous silicon thin film layer 30 formed on the base substrate, and at a surface of the amorphous silicon thin film layer 30, there is a structure having multiple small pores 31. It is to be noted that, the array substrate is not subjected to a laser annealing treatment yet.

In a different embodiment, the depth of small pores 31 of the amorphous silicon thin film layer 30 may be smaller than or equal to the thickness of the amorphous silicon thin film layer 30. In one embodiment, a buffer layer 20 is formed between the amorphous silicon thin film layer 30 and the base substrate 10.

A manufacturing method of the array substrate according to an embodiment of the invention includes: depositing an amorphous silicon thin film layer 30 on a base substrate 10; and performing a patterning process on the amorphous silicon thin film layer 30 so as to form a structure with multiple small pores 31 at a surface of the amorphous silicon thin film layer 30.

The base substrate 10 according to an embodiment of the invention may be made of glass, quartz, a transparent region or other substance.

In one example, before the amorphous silicon thin film layer 30 is deposited on the base substrate 10, the method may further include depositing a buffer layer 20 on the base substrate, and then the amorphous silicon thin film layer is deposited on the buffer layer 20. The buffer layer 20 may serve a function of preventing an active layer from being polluted. The buffer layer 20 may include a SiOx layer 22 and a SiNx layer 21. The SiNx layer 21 is located between the base substrate 10 and the SiOx layer 22, and the amorphous silicon thin film layer 30 is formed on the SiOx layer 22.

Figure 4:
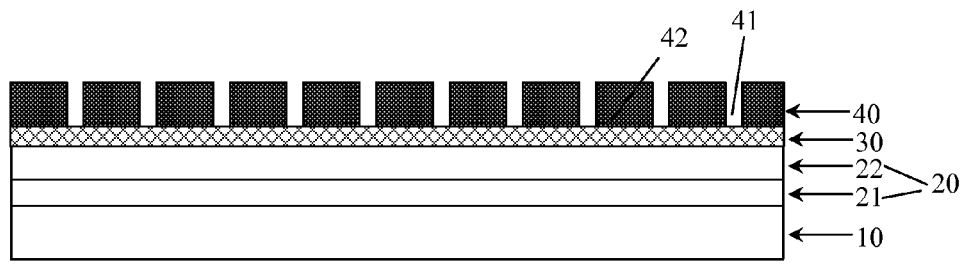
FIG. 4 is a structurally schematic view illustrating an array substrate after etching of a photoresist layer in the first embodiment of the invention.

The forming method of the structure with multiple small pores 31 of the amorphous silicon thin film layer 30 according to the embodiment, for example, may include that, a photoresist layer 40 is coated on a surface of the amorphous silicon thin film layer 30, and then is irradiated with light at a certain wavelength through a mask, thus exposure and development are conducted with respect to the photoresist layer 40, so that a fully-retained region 42 and a fully-removed region 41 are formed in the photoresist layer 40. As shown in FIG. 4, the fully-removed region 41 corresponds to multiple small pores 31 to be formed at a surface of the amorphous silicon thin film layer 30, and the amorphous silicon thin film layer corresponding to the fully-removed region 41 of the photoresist layer 40 is etched by a first etch process, so as to form a structure with multiple small pores 31 at a surface of the amorphous silicon thin film layer 30, as shown in FIG. 5.

The first etch process may be a dry etching process or a wet etching process. The amorphous silicon thin film layer that is not protected by photoresist is etched away in an etch process, so as to obtain the structure with multiple small pores 31 at a surface of the amorphous silicon thin film layer 30.

Figure 6:
FIG. 6 is a structurally schematic view illustrating the array substrate after a laser annealing treatment on amorphous silicon in the first embodiment of the invention.

In one example, after a patterning process is performed on the amorphous silicon thin film layer so as to form a pattern with multiple small pores 31 at a surface of the amorphous silicon thin film layer 30, the method may further include performing a laser annealing treatment on the amorphous silicon thin film layer 30 so as to form a polysilicon thin film layer 60, as shown in FIG. 6. It is to be noted that, before the laser annealing treatment is performed on the amorphous silicon thin film layer so as to form the polysilicon thin film layer, the photoresist layer needs to be stripped off, in favor of performing the annealing treatment on the amorphous silicon material with laser.

During the course of etching the amorphous silicon thin film layer in correspondence with the fully-removed region 41 of the photoresist layer 40 by a first etch process in an embodiment of the invention, the amorphous silicon thin film layer in the fully-removed region 41 of the photoresist layer 40 may be partially or fully etched, so as to form the pattern of small pores 31 at a surface of the amorphous silicon thin film layer 30. FIG. 5 shows that the amorphous silicon thin film layer in correspondence with the fully-removed region 41 of the photoresist layer 40 is partially etched.

During the course of performing the laser annealing treatment, molten silicon after melting has a higher density of 2.53 g/cm$^3$, but as the small pores 31 has a hollow structure, the expanded liquid after melting can fill in the space of small pores 31 at a surface of the amorphous silicon thin film layer 30. Thus, after the laser annealing treatment, such a defect that the grain boundary has a larger protrusion, resulting from the fact that the excess volume of polysilicon is squeezed, can be avoided. As shown in FIG. 6, the polysilicon thin film layer 60 has no obvious protrusion.

In a different example, over a surface of the amorphous silicon thin film layer 30, 500 to 4000 small pores 31 per square millimeter may be formed, and the diameter of each through-hole is in the range of 1 to 8 micrometers. For example, the diameter of small pores 31 of the amorphous silicon thin film layer 30 may be 4 or 5 micrometers.

Embodiment 2

Figure 7:
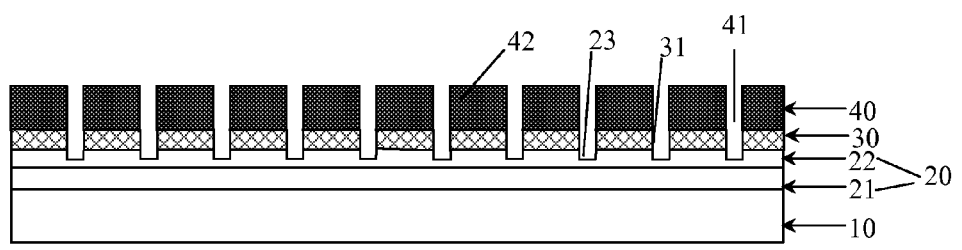
FIG. 7 is a structurally schematic view illustrating an array substrate after etching of an amorphous silicon thin film layer in a second embodiment of the invention.

As shown in FIG. 7, with respect to an array substrate according to an embodiment of the invention, the present embodiment differs from the array substrate in the first embodiment merely in that, the depth of small pores 31 of an amorphous silicon thin film layer 30 is equal to the thickness of the amorphous silicon thin film layer 30, and further voids 23 are formed at the locations of a buffer layer 20 underlying the amorphous silicon thin film layer 30, corresponding to the small pores 31 at a surface of the amorphous silicon thin film layer 30.

The manufacturing method in correspondence with the array substrate according to the present embodiment of the invention differs from the manufacturing method in the first embodiment merely in that, in the course of etching the amorphous silicon thin film layer in correspondence with a fully-removed region 41 of a photoresist layer 40 by a first etch process, the amorphous silicon thin film layer in correspondence with the fully-removed region 41 of the photoresist layer 40 is fully etched away, so as to form small pores 31 at a surface of the amorphous silicon thin film layer 30; meanwhile, the buffer layer 20 underlying the amorphous silicon thin film in correspondence with the fully-removed region of the photoresist layer 40 is etched by a second etch process, so as to form voids 23 in the buffer layer 20 that corresponds to the small pores in the amorphous silicon thin film layer, as shown in FIG. 7. In one example, the second etch process is a dry etching process.

Figure 8:
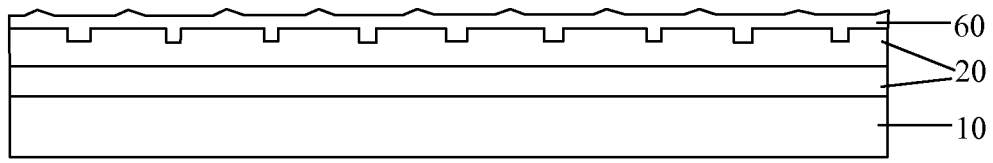
FIG. 8 is a structurally schematic view illustrating the array substrate after a laser annealing treatment on amorphous silicon in the second embodiment of the invention.

According to the embodiment, by means of fully etching the amorphous silicon thin film layer in correspondence with the fully-removed region 41 of the photoresist layer 40, and even partially etching the buffer layer 20 underlying the amorphous silicon thin film layer 30, after melting with laser, although the molten silicon after melting has a higher density of 2.53 g/cm$^3$, the liquid may fill the voids 23 of the buffer layer. Supposing that the voids 23 cannot hold it, the liquid may further fill the small pores 31 of the amorphous silicon thin film layer. The liquid in the voids 23 of the buffer layer is cured firstly to form nuclei, and the growth of crystals may be controlled by the nuclei, thereby avoiding a grain boundary with a larger protrusion from forming due to the fact that the excess volume of polysilicon is squeezed. Further, polysilicon with an evenly distributed density is formed, as shown in FIG. 8.

As the buffer layer 20 includes a SiOx layer 22 and a SiNx layer 21 that is situated between a base substrate 10 and the SiOx layer 22, and the amorphous silicon thin film layer 30 is formed on the SiOx layer 22, the voids 23 formed by etching the buffer layer 20 lie in the SiOx layer 22.

In the manufacturing methods of array substrates provided by a first embodiment and a second embodiment as stated above, after the polysilicon thin film layer 60 is formed, it is also possible that the polysilicon thin film layer 60 is doped to form a channel region, a source region and a drain region, and a gate insulating layer, a source electrode and a drain electrode that contact with the source region and the drain region through via holes, respectively, are formed over the polysilicon thin film layer, thereby forming a polysilicon thin film transistor. A planarization layer may be arranged on the array substrate with the above polysilicon thin film transistor formed thereon, and a pixel electrode electrically connected to the drain electrode of the polysilicon thin film transistor is formed on the planarization layer. Accordingly, an array substrate manufactured by using the above method may include a polysilicon thin film transistor that includes an active layer, a source electrode and a drain electrode, a planarization layer and a pixel electrode that is connected to the drain electrode, the active layer includes a channel region, a source region and a drain electrode, and the source electrode and the drain electrode are connected to the source region and the drain region through via holes, respectively.

Embodiment 3

According to an embodiment of the invention, there is provided a manufacturing method of a thin film transistor, which includes: an amorphous silicon thin film layer is deposited on a base substrate; a patterning process is conducted on the amorphous silicon thin film layer so as to form a pattern with multiple small pores 31 at a surface of the amorphous silicon thin film layer.

In an example, the manufacturing method may further include that, before the amorphous silicon thin film layer is deposited on the base substrate, a buffer layer is deposited on the base substrate.

In an example, the manufacturing method may further include that, after the patterning process is conducted on the amorphous silicon thin film layer so as to form the pattern with multiple small pores 31 at a surface of the amorphous silicon thin film layer, the amorphous silicon thin film layer is subjected to a laser annealing treatment to form a polysilicon thin film layer.

In a manufacturing method provided by an example, a photoresist layer is coated on a surface of the amorphous silicon thin film layer, and exposure and development are conducted with respect to the photoresist layer, so that a fully-retained region and a fully-removed region are formed in the photoresist layer. The fully-removed region corresponds to multiple small pores to be formed at a surface of the amorphous silicon thin film layer, and the amorphous silicon thin film in correspondence with the fully-removed region of the photoresist layer is etched by a first etch process, so as to form a pattern with multiple small pores at a surface of the amorphous silicon thin film layer.

In a manufacturing method provided by an example, the amorphous silicon thin film in correspondence with the fully-removed region of the photoresist layer is partially etched or fully etched away by a first etch process, so as to form a pattern with multiple small pores at a surface of the amorphous silicon thin film layer.

In an example, the manufacturing method may further include that, after the amorphous silicon thin film in correspondence with the fully-removed region of the photoresist layer is etched by the first etch process so as to form the pattern with multiple small pores at a surface of the amorphous silicon thin film layer, a buffer layer underlying the amorphous silicon thin film in correspondence with the fully-removed region of the photoresist layer is partially etched by a second etch process, so as to form voids in the buffer layer that correspond to the small pores in the amorphous silicon thin film layer.

In manufacturing methods provided in different examples, at a surface of the amorphous silicon thin film layer, per square millimeter, 500 to 4000 small pores may be formed.

In one example, after formation of the polysilicon thin film layer 60, it is also possible that the polysilicon thin film layer 60 is doped to form a channel region, a source region and a drain region, and a gate insulating layer, a source electrode and a drain electrode that contact with the source region and the drain region through via holes, respectively, are formed over the polysilicon thin film layer, thereby forming a polysilicon thin film transistor.

As regards implementation of the manufacturing method of the thin film transistor, the first embodiment and the second embodiment may be referred to as well, and repetitions are omitted here.

According to an embodiment of the invention, there is further provided a thin film transistor, which is prepared by using the manufacturing method of the thin film transistor provided by any of the above examples. The polysilicon thin film transistor may include an active layer, a source electrode and a drain electrode, the active layer includes a channel region, a source region and a drain region, and the source electrode and the drain electrode are connected to the source region and the drain region through via holes, respectively.

According to an embodiment of the invention, there is further provided an array substrate, in which, gate lines and data lines go across each other to define pixel units arranged in an array form, and each of the pixel units includes a thin film transistor according to an embodiment of the invention that functions as a switching element. For example, the thin film transistor is obtained by using any of the manufacturing methods of thin film transistor as stated above. For example, the array substrate may be an array substrate for an organic light-emitting diode (OLED), an electronic paper, or a liquid crystal display (LCD).

According to at least one embodiment of the invention, there is further provided a display device, which includes the array substrate provided by any of the above embodiments. The display device may be a liquid crystal panel, an electronic paper, an OLED panel, a cell phone, a tablet computer, a television, a display, a notebook computer, a digital photo frame, a navigator, or any other product or component having a display function.

According to at least one embodiment of the invention, there are provided a thin film transistor and a manufacturing method thereof, an array substrate and a manufacturing method thereof, and a display device. The manufacturing method of the array substrate includes depositing an amorphous silicon thin film layer on a base substrate; and performing a patterning process on the amorphous silicon thin film layer, so as to form a pattern with multiple small pores at a surface of the amorphous silicon thin film layer. Thus, when a laser annealing treatment of amorphous silicon is performed, the molten silicon after melting fills in the space of the small pores firstly, so as to avoid forming a protruded grain boundary that is produced because the excess volume of polysilicon is squeezed.

In summary, effects produced by embodiments of the invention mainly include the following aspects.

By partially etching or fully etching away the amorphous silicon thin film layer in correspondence with a fully-removed region of a photoresist layer, a pattern with multiple small pores is formed at a surface of the amorphous silicon thin film layer. In this way, although molten silicon after melting has a higher density that may reach 2.53 g/cm$^3$; because the small pores of the amorphous silicon thin film layer has a hollow structure, the expanded liquid after melting may fill the space of small pores. Thus, a protruded grain boundary that is formed because the excess volume of polysilicon is squeezed can be avoided.

By fully etching away the amorphous silicon thin film layer in correspondence with a fully-removed region of a photoresist layer, and even partially etching silicon oxide in a buffer layer underlying the amorphous silicon thin film layer to form voids in the buffer layer, after melting with laser, the liquid will fill the voids of silicon oxide, and the liquid in the voids will be cured firstly to form nuclei. The growth of crystals is controlled, thereby avoiding forming a grain boundary with a larger protrusion that is formed because the excess volume of polysilicon is squeezed, and thus, polysilicon with an evenly distributed density is formed.

Descriptions made above are merely preferred embodiments of the invention, and it should be noted that, for those ordinarily skilled in the art, without departing from the technical principle of the invention, a number of modifications and substitutions can also be made by them, and these modifications and substitutions shall also be deemed as the protection scope of the invention.

This application claims the benefit of priority from Chinese patent application No. 201410083721.3, filed on Mar. 7, 2014, the disclosure of which is incorporated herein in its entirety by reference as a part of the present application.

What is claimed is:

1. A manufacturing method of an array substrate, comprising depositing an amorphous silicon thin film layer on a base substrate;
   performing a patterning process on the amorphous silicon thin film layer, wherein a photoresist layer is coated on a surface of the amorphous silicon thin film layer and exposure and development are conducted with respect to the photoresist layer, and wherein the amorphous silicon thin file layer is correspondence with the fully-removed region of the photoresist layer is partially etched or fully etched away by a first etch process so as to form a pattern with multiple small pores at a surface of the amorphous silicon thin film layer; and
   etching a buffer layer underlying the amorphous silicon thin film layer in correspondence with the fully-removed region of the photoresist layer by a second etch process, so as to form voids in the buffer layer in correspondence with the small pores in the amorphous silicon thin film layer.

2. The manufacturing method claimed as claim 1, before the amorphous silicon thin film layer is deposited on the base substrate, further comprising depositing the buffer layer on the base substrate.

3. The manufacturing method claimed as claim 1, further comprising:
   after the patterning process is performed on the amorphous silicon thin film layer, conducting a laser annealing treatment on the amorphous silicon thin film layer so as to form a polysilicon thin film layer.

4. The manufacturing method claimed as claim 1, wherein, at the surface of the amorphous silicon thin film layer, 500 to 4000 small pores are formed per square millimeter.

5. An array substrate, wherein the array substrate is prepared by using the manufacturing method of claim 1.

6. A manufacturing method of a thin film transistor, comprising:
   depositing an amorphous silicon thin film layer on a base substrate;
   performing a patterning process on the amorphous silicon thin film layer, wherein a photoresist layer is coated on a surface of the amorphous silicon thin film layer, and exposure and development are conducted with respect to the photoresist layer, so that a fully-retained region and a fully-removed region are formed in the photoresist layer, and wherein the amorphous silicon thin film layer in correspondence with the fully-removed region of the photoresist layer is partially etched or fully etched away by a first etch process so as to form a pattern with multiple small pores at a surface of the amorphous silicon thin film layer, and etching a buffer layer underlying the amorphous silicon thin film layer in correspondence with the fully-removed region of the photoresist layer by a second etch process, so as to form voids in the buffer layer in correspondence with the small pores in the amorphous silicon thin film layer.

7. The manufacturing method claimed as claim 6, further comprising:

before the amorphous silicon thin film layer is deposited on the base substrate, depositing the buffer layer on the base substrate.

8. The manufacturing method claimed as claim 6, further comprising:

after the patterning process is performed on the amorphous silicon thin film layer, conducting a laser annealing treatment on the amorphous silicon thin film layer, so as to form a polysilicon thin film layer.

9. The manufacturing method claimed as claim 6, wherein, at the surface of the amorphous silicon thin film layer, 500 to 4000 small pores are formed per square millimeter.

10. A thin film transistor, wherein the thin film transistor is prepared by using the manufacturing method of the thin film transistor claimed as claim 6.

11. An array substrate,
wherein the array substrate
comprises the thin film transistor of claim 10.

12. The array substrate claimed as claim 11, wherein, a depth of the small pores of the amorphous silicon thin film layer is smaller than or equal to a thickness of the amorphous silicon thin film layer.

13. The array substrate claimed as claim 11, wherein, a buffer layer is formed between the amorphous silicon thin film layer and the base substrate, and voids are formed at locations of the buffer layer in opposition to the small pores at a surface of the amorphous silicon thin film layer.

14. A display device, comprising the thin film transistor claimed as claim 10.

* * * * *